(12) United States Patent
Nishimura

(10) Patent No.: US 6,907,198 B2
(45) Date of Patent: Jun. 14, 2005

(54) WAVELENGTH DIVISION MULTIPLEXED OPTICAL INTERCONNECTION DEVICE

(75) Inventor: Shinji Nishimura, Niiza (JP)

(73) Assignee: Hitachi, Ltd., Tokyo (JP)

(*) Notice: Subject to any disclaimer, the term of this patent is extended or adjusted under 35 U.S.C. 154(b) by 640 days.

(21) Appl. No.: 09/917,707

(22) Filed: Jul. 31, 2001

(65) Prior Publication Data
US 2003/0025962 A1 Feb. 6, 2003

(30) Foreign Application Priority Data
Sep. 21, 2000 (JP) ........................................ 2000-286753

(51) Int. Cl.[7] .............................................. H04J 14/02
(52) U.S. Cl. .......................... 398/79; 398/91; 398/141; 398/154; 398/164; 385/14
(58) Field of Search ............................. 398/79, 91–92, 398/141, 154, 164; 385/14, 24; 257/84; 375/327, 373

(56) References Cited
U.S. PATENT DOCUMENTS
5,394,489 A * 2/1995 Koch .......................... 385/14

* cited by examiner

Primary Examiner—Kinfe-Michael Negash
(74) Attorney, Agent, or Firm—Antonelli, Terry, Stout & Kraus, LLP

(57) ABSTRACT

A high-speed and small-sized optical interconnection device uses wavelength-multiplexed light suitable therefor in order to make compatible between an increase in high-speed communication capacity of the optical interconnection device and an increase in high-speed communication distance thereof. A signal processing LSI is placed within a central portion of a main surface of a semiconductor substrate, and input/output units for transmitting and receiving optical wavelength-multiplexed lights are multi-chip integrated on the periphery of the main surface of the semiconductor substrate into a single package, and a wiring length can be reduced and a physical signal band for each connecting wiring can be enlarged. Further, the signal processing LSI is made up of CMOS and a driver circuit for each optical transmitting/receiving element is comprised of a Si—Ge transistor circuit, whereby a modulated signal band can be enlarged and the performance of the input/output optical signals from the device can be improved.

12 Claims, 8 Drawing Sheets

WAVELENGTH DIVISION MULTIPLEXED OPTICAL INTERCONNECTION DEVICE

BACKGROUND OF THE INVENTION

1. Field of the Invention

The present invention relates to an optical interconnection device using wavelength division multiplexed lights.

2. Description of the Related Art

The use of an optical interconnection device is very effective in increasing a data throughput of a data connection system lying within or between devices of a computer system and a transmission-exchanger. The term optical interconnection means communication technology wherein optical signal transfer systems comprised of optical emitters, optical receivers and optical fibers are parallel-driven to transmit signals upon short-range data communication connections within/between the devices. Through the use of the optical interconnection, high-capacity data communication connections can be implemented with a small-sized device scale and with a low delay.

As examples reported up to now as to optical interconnection devices, may be mentioned, an example in which optical receivers and emitters and their driver circuits are brought into integration and utilized in combination with a signal processing circuit of a package different therefrom, an example in which elements for receiving and emitting a single optical signal are implemented in the same package as a signal processing LSI, an example in which individually-produced wavelength-multiplexed elements, wavelength-demultiplexing elements and a signal processing LSI are placed on another substrate, etc.

There are known, for example, IEEE PHOTONICS TECHNOLOGY LETTERS, Vol. 4, No. 6, June 1992, P614–617, "Operation of a Fully Integrated GaAs—Al$_x$Ga$_{1-x}$As FET-SEED: A Basic Optically Addressed Integrated Circuit", T. K. Woodward et. al (fist prior art), the 1999 Communications Society Conference of the Institute of Electronics, Information and Communication Engineers, B-10-134, P311, "Optical interconnection Intellectual Property (OIP) for System-On-Chip LSIs", Ryuji Yoshikawa, et. al (second prior art), IEEE 802.3 HSSG Interim Meeting, Idaho, June 1999, "WWDM Transceiver Module for 10-Gb/s Ethernet", B. E. Lemoff (third prior art), and the like.

However, any of the reports does not disclose one wherein laser diodes, photo diodes, their driver circuits, optical multiplexers, optical demultiplexers and an electric signal processing circuit are not brought into integration on a single semiconductor substrate.

On the other hand, Japanese Patent Laid-Open No. Hei 8-32046 (fourth prior art) filled jointly by the inventors of the present application is known as one wherein they are brought into integration on the single semiconductor substrate. It discloses a photo-electron integration device wherein an optical demultiplexer, an optical multiplexer and an optical waveguide are respectively comprised of a compound semiconductor.

When it is desired to increase a communication data throughput of an optical interconnection device, a restriction on the number of electric wirings connecting between optical transmitting and receiving elements and a signal processing LSI constituting the optical interconnection device, and a data band produce a bottleneck upon increase in communication capacity.

With a view toward increasing the capacity for data communication connections between respective elements constituting an optical interconnection device, there are known two methods: one for increasing the number of wirings for connecting between constituent elements and another for increasing a modulation rate of each signal line. Even in the existing device, however, an LSI of 1000-pin class has already been used within the device. A subsequent drastic increase in the number of pins and an increase in the number of wirings are difficult in terms of the manufacturing cost.

Even in the case of the modulation rate, a modulation band itself of a transistor circuit can be enlarged up to the neighborhood of 20 GHz by use of a silicon germanium transistor. However, a limitation on a circuit characteristic of a glass epoxy or polyimide system printed board on which elements are hybrid-packaged, is the neighborhood of 2.5 GHz.

Therefore, the method of independently packaging the various elements employed in the devices described in the first through third prior arts, hybrid-packaging them on a printed board and increasing a data throughput of each device by a multi-pin connection of high-speed wirings encounters difficulties in obtaining an optical interconnection device for transmitting high-speed signals exceeding 1 Gbit per second every signals with satisfactory reproducibility.

In the technology of integrating the signal processing LSI and the optical receivers and emitters without having to use the wavelength multiplexing as in the second prior art, the number of inputtable/outputtable optical signals is restricted depending on the number of fibers capable of being taken out from one integrated package. Since the volume of a connector is large even if a fiber small in cable volume, such as a ribbon fiber is used, the number of fibers capable of being taken out from one package is limited to about 20. It is thus considered that only about 50 Gbit per second is obtained as the communication capacity.

When a device showing the third prior art is used wherein laser optical emitters, optical receivers and wavelength-division demultiplexing elements are brought into integration, particularly when it is desired to actually execute electric signal processing operations such as signal path switching, it is necessary to connect a signal processing LSI distinct from driver circuit elements for a laser and a photo diode. Further, electrical wiring connections to the signal processing LSI will produce a bottleneck and hence an increase in communication capacity is difficult as expected.

Japanese Patent Laid-Open No. Hei 8-32046 (fourth prior art) has firstly proposed the implementation of all of the signal processing circuit, laser optical emitters and receivers, optical multiplexing elements and optical demultiplexing elements on one semiconductor substrate. However, since the optical demultiplexer, optical multiplexer and optical waveguide are respectively comprised of the compound semiconductor, it is difficult to realize a small-sized multiplexed optical interconnection device.

A problem to be solved by the present invention is to make compatible between an increase in high-speed communication capacity of an optical interconnection device and an enlargement of a high-speed communication distance.

An object of the present invention is to provide a high-speed and small-sized optical interconnection device using wavelength-multiplexed lights suitable therefor.

SUMMARY OF THE INVENTION

Summaries of typical ones of the inventions disclosed in the present application will be described in brief as follows:

A wavelength division multiplexed optical interconnection device according to the present invention comprise a plurality of optical signal input units each comprising a plurality of optical receivers for respectively receiving a plurality of pieces of light and converting the pieces of light into first electric signals. The optical signal input units are placed in L-shaped form or C-shaped form across sides adjacent to a peripheral portion of a main surface of a single square semiconductor. Further a signal processing integrated circuit has a logic circuit for effecting a path switching process on the first electric signals delivered from the plurality of optical receivers and for generating second electric signals. The signal processing integrated circuit is placed in a central portion of the main surface of the semiconductor substrate. Moreover a plurality of optical signal output units each comprises a plurality of optical emitters for respectively converting the second electric signals generated by the signal processing integrated circuit into lights, an optical multiplexer for wavelength-multiplexing the plurality of lights emitted from the optical emitters, and fibers for transmitting the wavelength-multiplexed light sent from the optical multiplexer to the outside. The optical signal output units are placed in inverted L-shaped form or C-shaped form so as to be opposite to the plurality of optical signal units across the sides adjacent to the peripheral portion of the main surface of the semiconductor substrate.

Thus, a high-capacity and small-sized wavelength division multiplexed optical interconnection device can be implemented which efficiently utilizes a main surface of a semiconductor substrate with an electric signal processing integrated circuit being integrated thereon and lessens trouble about a signal delay developed between input and output units.

Optical receiver driver circuits for respectively driving a plurality of optical receivers, and optical emitter driver circuits for respectively driving a plurality of optical emitters are respectively integrally-formed and placed within a semiconductor substrate located below peripheral portions in which optical signal input and output units are placed. Thus a more efficient, small-sized and high-performance wavelength division multiplexed optical interconnection device can be provided.

A plurality of optical signal input units and a plurality of optical signal output units are placed symmetrically with respect to one another on the periphery of a square main surface of a semiconductor substrate. Consequently, the property of transfer of electric signals outputted from optical signal input units to a signal processing integrated circuit integrally formed within a central main surface of the semiconductor substrate, and the property of transfer of electric signals to optical signal output units from the signal processing integrated circuit can be obtained at high speed and uniformly.

Further, at least one phase-locked loop circuit for controlling the transfer of electric signals to a plurality of optical emitter driver circuits in liaison with a logic circuit for performing the signal-path switching process is integrally formed within a semiconductor substrate located below the center of a peripheral portion at which the plurality of optical emitters driver circuits are placed. Thus effective countermeasures against noise produced in the phase-locked loop circuit can be taken. Therefore, similarly, such an effect is high for a large-capacity interconnection device using wavelength-multiplexed lights intended for the present application in particular.

Furthermore, a plurality of optical receiver driver circuits and optical emitter driver circuits are formed in an Si—Ge semiconductor region, and a signal processing integrated circuit is comprised of a CMOS circuit, whereby a wavelength division multiplexed optical interconnection device having an excellent characteristic can be provided.

More specifically, all the terminals for respectively supplying source voltages to a plurality of optical receiver driver circuits, optical emitter driver circuits and a signal processing integrated circuit are caused to lead out to the back of an insulating substrate mounted to a bottom face of a semiconductor substrate. Thus it is possible to facilitate the implementation of such a wavelength division multiplexed optical interconnection device on electronic equipment such as a communication apparatus and improve delay characteristics of various signals employed in an electronic equipment system.

Still more specifically, in the present invention, a silicon germanium transistor circuit is used for a signal processing LSI and data input/output units for laser and photo diode driver circuits to implement a signal band of an I/O clock of up to about 20 GHz with the objective of increasing a data throughput of an optical interconnection device. Further, as a method of packaging these internal elements, hybrid packaging using each individual packages and multi-chip integration of optical elements (laser and photo diode) into an upper portion of one semiconductor substrate constituting a signal processing LSI by use of a single package are carried out. Thus it is possible to set electric signal wirings between both the signal processing LSI and input/output units as short as possible. Furthermore, since no printed board wirings are interposed therebetween for connections between the two, a driving band can be improved up to about 10 Gbit per second. Since a deskew re-timing circuit for synchronizing each parallel signal and an error correction coding circuit are placed in a data input/output unit of the signal processing LSI, an interface connection to an internal synchronizing circuit of the signal processing LSI is allowed. Further, a wavelength multiplexing transmission system is used for an optical data input/output system to achieve long-range data transfer. Loading an optical input/output device with a wavelength multiplex system makes it possible to superpose parallel signals on signals different in wavelength and achieve parallel transmission using one fiber.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

First Embodiment

Figure 1:
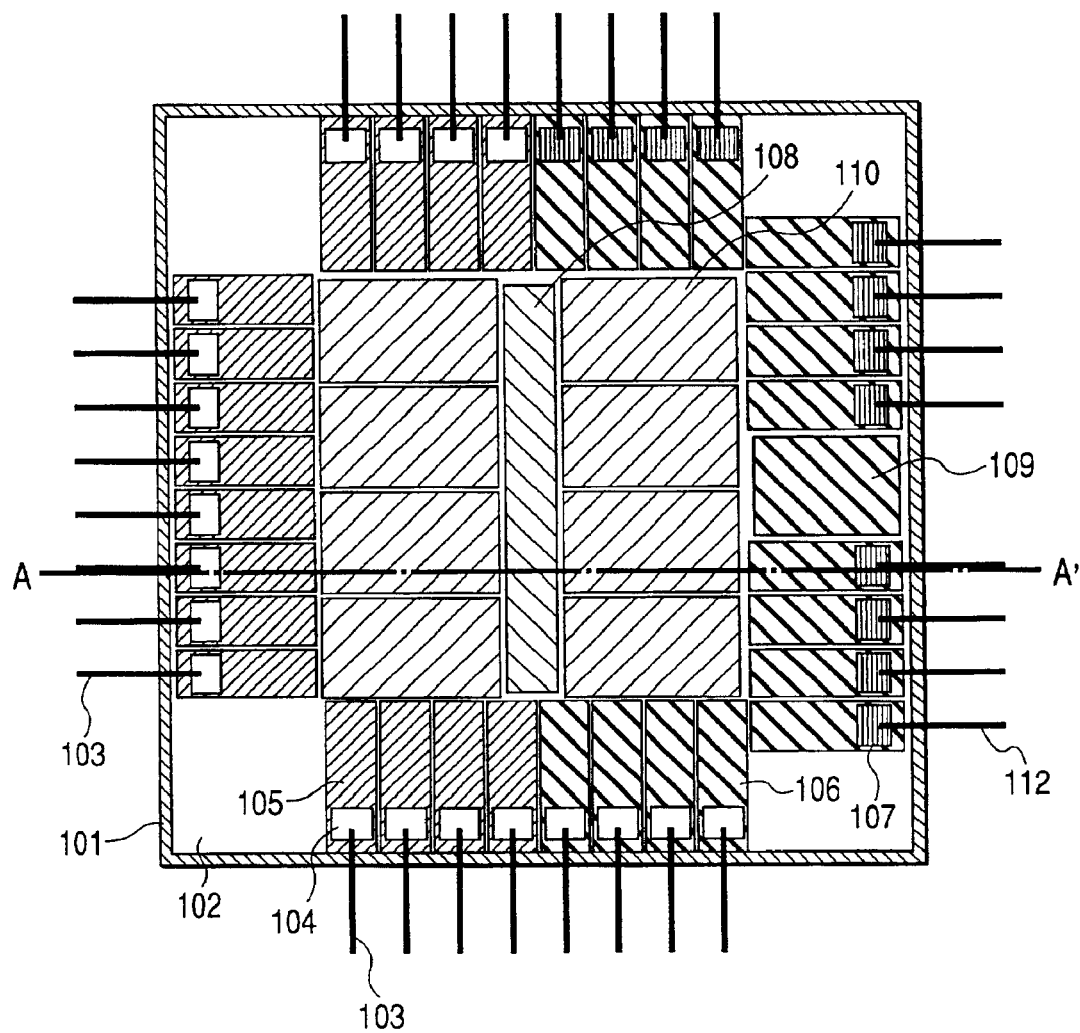
FIG. 1 is a plan view for describing an internal layout of an optical interconnection device according to a first embodiment of the present invention.
Figure 2:
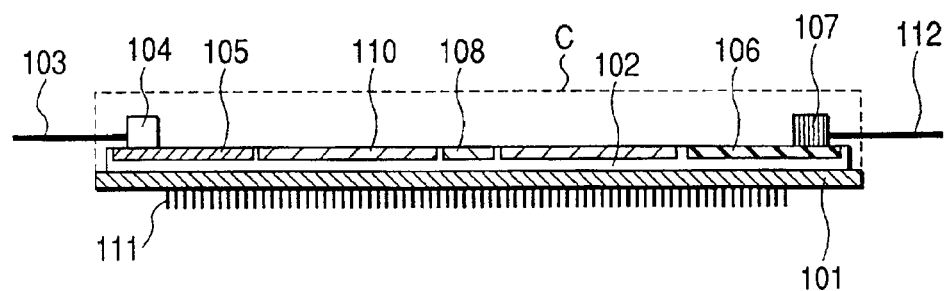
FIG. 2 is a cross-sectional view illustrating an essential portion taken along line A–A' of the optical interconnection device shown in FIG. 1.
Figure 3:
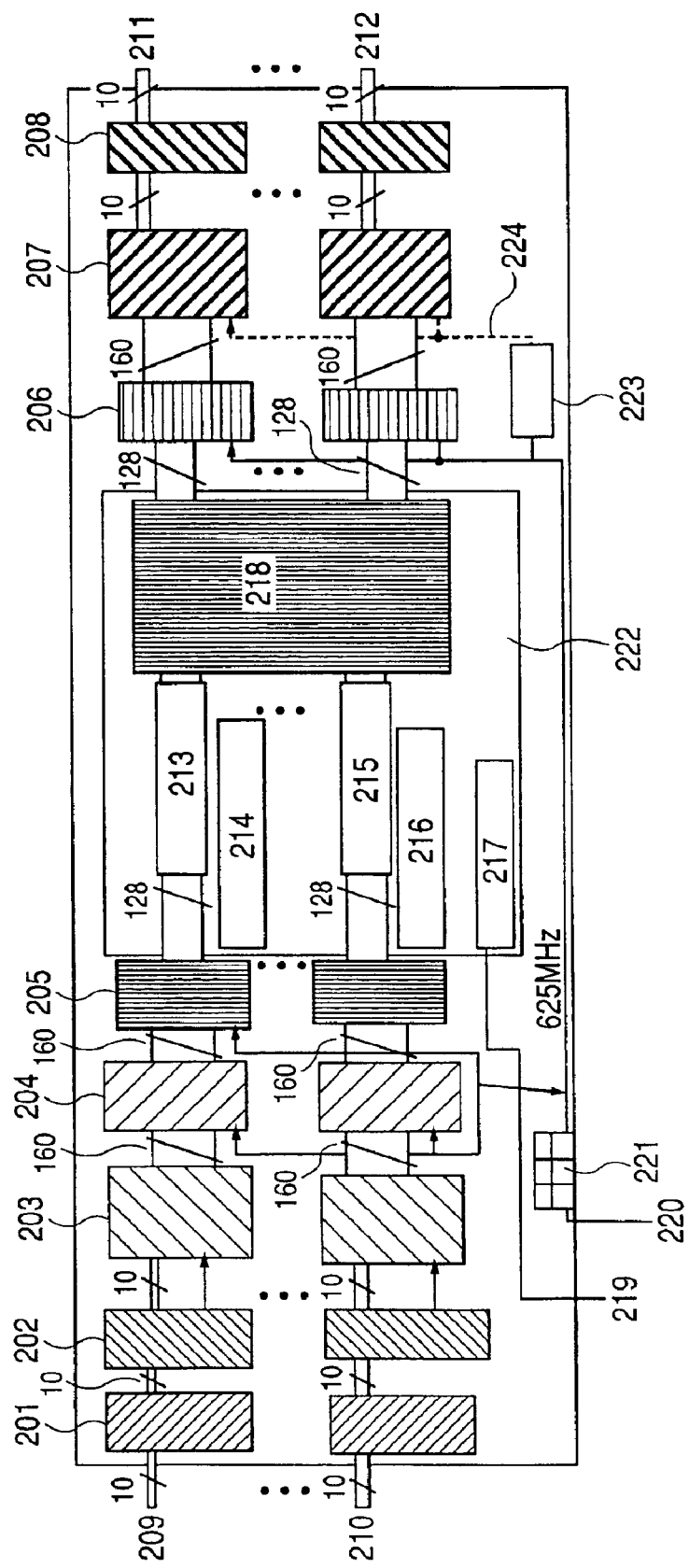
FIG. 3 is a circuit functional block diagram illustrating an essential portion of the optical interconnection device shown in FIG. 1.
Figure 4:
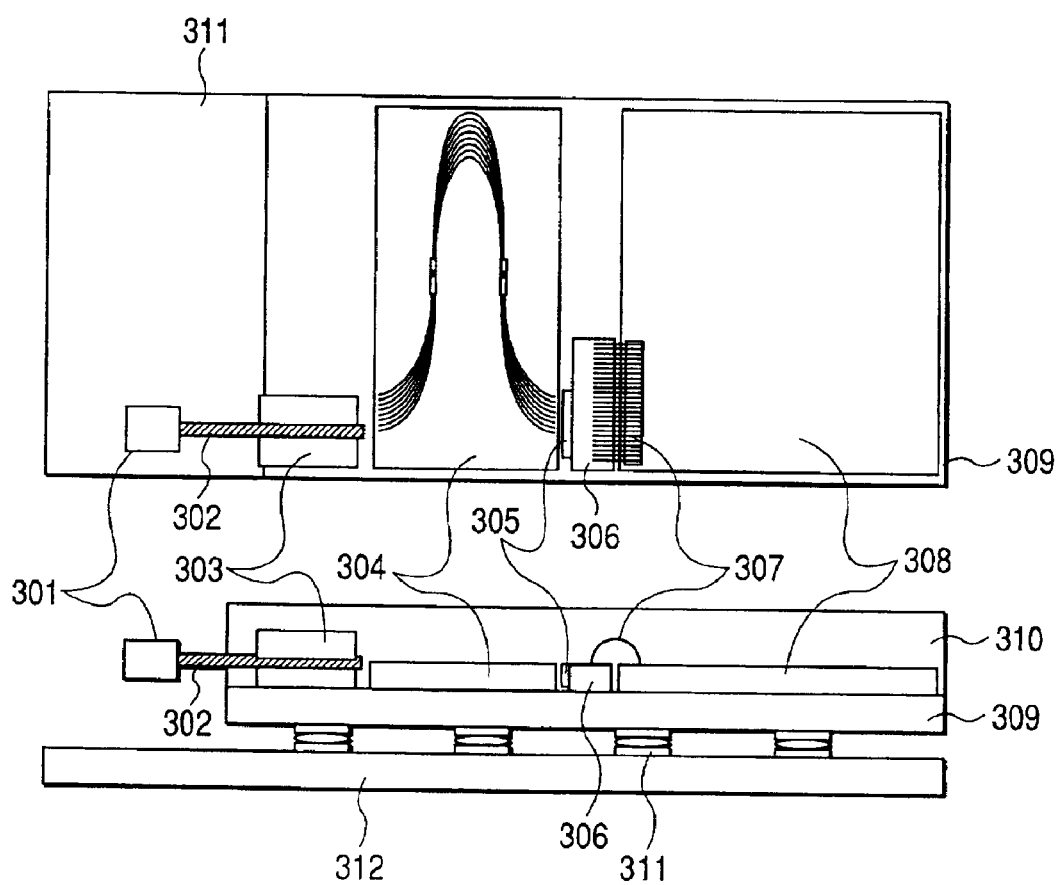
FIG. 4 is an enlarged view illustrating an essential portion of an optical input unit employed in the optical interconnection device shown in FIG. 1.
Figure 5:
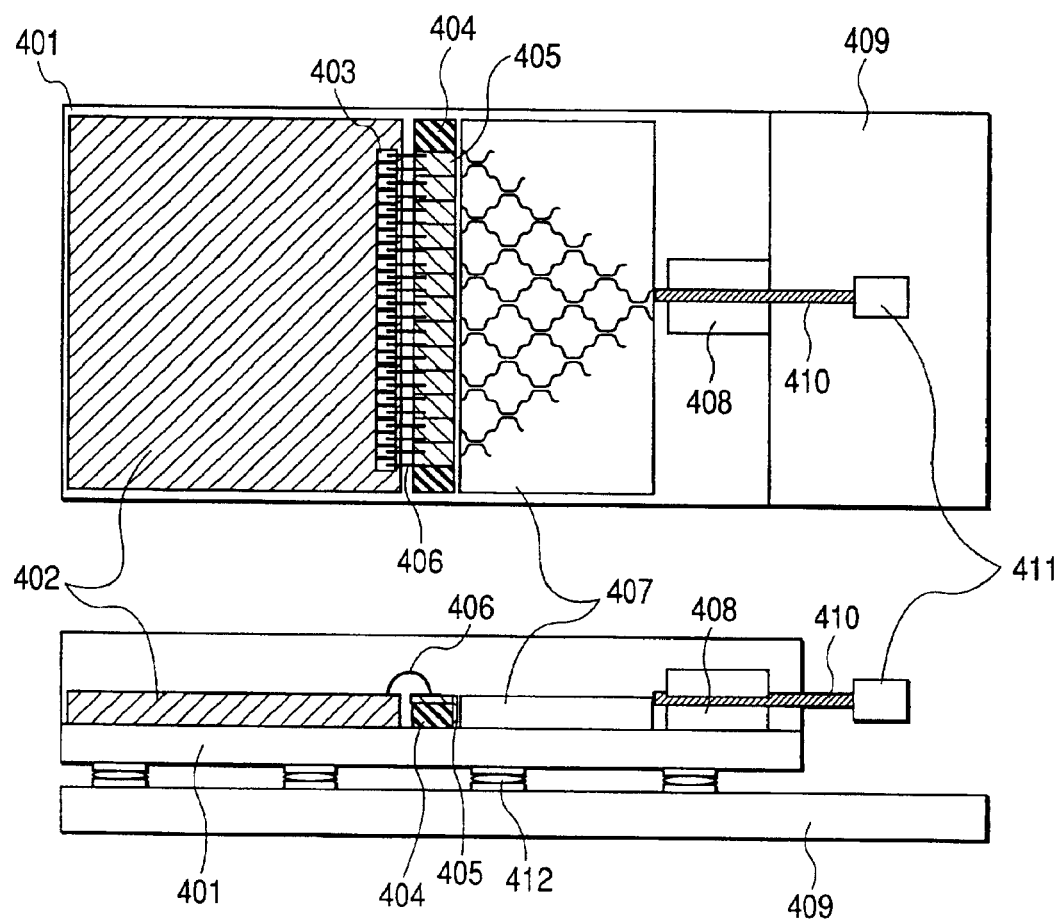
FIG. 5 is an enlarged view illustrating an essential portion of an optical output unit employed in the optical interconnection device shown in FIG. 1.

Preferred embodiments of the present invention will be described with reference to FIGS. 1 through 5. FIG. 1 is a plan view for describing a layout of an essential portion of a wavelength division multiplexed optical interconnection device according to the present invention, which is integrated on one semiconductor substrate or within one package. FIG. 2 is a cross-sectional view illustrating an essential portion taken along line A–A' in FIG. 1. FIG. 3 is a circuit functional block diagram illustrating an essential portion which constitutes the inside of a signal processing LSI of the wavelength division multiplexed optical interconnection device, respectively. FIG. 4 is an enlarged view illustrating an essential portion of an optical input unit mounted on a printed circuit board. FIG. 5 is an enlarged view illustrating an essential portion of an optical output unit placed on the printed circuit board, respectively. Incidentally, the planes of the optical input and output units are shown on the upper sides in FIGS. 4 and 5 and the cross-sections thereof are shown on the lower sides in FIGS. 4 and 5.

The present device has a structure wherein an optical data input/output functional unit is integrated into one with an upper portion of a peripheral portion of a main surface of one semiconductor substrate constituting the signal processing LSI by means of a flip-chip integration technology or the like.

A signal processing circuit unit is formed on a main surface of a substantially-square rectangular sub-mount (substrate) 102 comprised of a semiconductor material such as Si by the normal LSI manufacturing technology. The signal processing circuit unit comprises a logic circuit 108 for a signal-path switching function, which is placed substantially in the central portion of the main surface, and large-scale memories 110 (represented in the form of eight blocks in FIG. 1) each used for a data signal buffer function, which are disposed on the periphery of the logic circuit 108.

A plurality of optical data input functional units 104 (sixteen in FIG. 1) are provided at the peripheral edge portion of the left half of the main surface of the sub-mount 102. A plurality of photodiode driver circuits 105 (designated at numerals 308 in FIG. 4) for respectively driving a plurality of photodiodes 305 and transferring their electric signal outputs to the signal processing circuit unit are disposed thereat. There are also disposed at its upper portion or in the neighborhood thereof, a plurality of fiber fixing members 303 having V-shaped grooves for fixing and holding a plurality of optical fibers 103 and 302 for respectively transmitting lights, an arrayed waveguide grating demultiplexer 304 comprised of a Lithium Niobate Titanium material, a glass waveguide, or an organic polyimide material, for performing wavelength division demultiplexing of wavelength-multiplexed lights from leading ends of the optical fibers 103 and 302 to thereby output a plurality of optical signals, a plurality of photodiodes 305 for respectively receiving the plurality of optical signals wavelength-division demultiplexed from the demultiplexer 304 and converting them into electric signals, a plurality of photodiode sub-mounts 306 which support (i.e., mount) the photodiodes 305 thereon, and a plurality of bonding wires 307 for respectively electrically connecting the photodiode sub-mounts 306 and the photodiode driver circuits 105 and 308 to one another.

Further, the electric signals converted by these photodiodes 305 are transmitted to the signal processing circuit unit consisting of the logic circuit 108 and the large-scale memories 110.

A plurality of optical data output functional units 107 (sixteen in FIG. 1) are provided at the peripheral edge portion of the right half of the main surface of the semiconductor sub-mount 102. A plurality of laser diode driver circuits 106 (designated at numerals 402 in FIG. 5) for respectively transferring the electric signals outputted from the signal processing circuit units 108 and 110 to a plurality of laser diodes 405 for converting the electric signals into lights are disposed at the peripheral edge portion. There are also disposed at its upper portion or in the vicinity thereof, a plurality of laser diodes 405 for respectively converting the electric signals outputted from the signal processing circuit units 108 and 110 into their corresponding pieces of optical light, a plurality of laser diode sub-mounts 404 which support (i.e., mount) the laser diodes 405 thereon, a plurality of bonding wires 406 for respectively electrically connecting the laser diodes 405 and the laser diode driver circuits 402, a waveguide multiplexer 407 for receiving the plurality of optical signals outputted from the laser diodes 405 and wavelength-multiplexing them, a plurality of optical transmission fibers 112 and 410 for receiving the wavelength-multiplexed lights sent from the waveguide multiplexer 407 and causing them to lead to the outside, and a plurality of fiber fixing members 408 having V-shaped grooves for fixing and holding the optical transmission fibers 112 and 410.

In the present embodiment, the optical data input functional units 104 respectively comprise sixteen fibers 103 and 302 for introducing pieces of wavelength-multiplexed light, arrayed branching grating demultiplexers 304 for receiving the wavelength-multiplexed light from these fibers and separating them every wavelengths, and photodiodes 305 for converting signals of optical wavelength lights outputted from the arrayed branching grating demultiplexer 304 into their corresponding electric signals and the like. They are disposed in a C-shaped fashion on the periphery of the left half as viewed from above the main surface of the semiconductor substrate 102. The optical data output functional units 107 respectively comprise laser optical emitters 405, waveguide multiplexers 407 for wavelength-multiplexing optical wavelength laser lights emitted from the laser optical emitters, and sixteen fibers 112 and 410 for causing their multiplexed lights to lead to the outside and the like. They are disposed in an inverted C-shaped fashion on the periphery of the right half. The optical data input functional units 104 and the optical data output functional units 107 are substantially approximately symmetrical with respect to one another. In the present embodiment, the optical data input functional units 104 and the optical data output functional units 107 are respectively placed in opposition in the C-shaped fashion and the inverted C-shaped fashion over the three sides adjacent to one another. However, they are not limited to it but may respectively be placed in opposition in an L-shaped manner and an inverted L-shaped manner over the two sides adjacent to one another.

In the present embodiment, the signal processing circuit unit comprises a CMOS circuit in which the large-scale memories for the function of buffering input data signals and the logic circuit for the path switching function are brought into integration, and a silicon germanium transistor circuit equipped with a high-speed signal processing function comprising a signal multiplexing-demultiplexing operation, encoding/decoding of each error correction/deskew code, a phase-locked loop and re-timing function.

The optical data input/output functional unit comprises an optical data input portion comprised of fibers, photodiodes, and driver circuits therefor, and an optical data output portion comprised of laser diodes, their driver circuits and fibers.

In the present embodiment, as indicated by one unit portion in FIG. 4, 10-bit parallel light input signals are inputted to the device through one fiber 302 in a state of being multiplexed in wavelength division. The input wavelength multiplexed light input signals of 10 Gbit per second× 10 bits are 10 bit-demultiplexed every wavelengths contained therein by the arrayed waveguide grating device 304 and inputted to the surface mounted type photo diode array 305, where they are converted into parallel electric signals of 10 Gbit per second×10 bits.

Upon actual assembly, the signal processing LSI including the diode driver circuits, the optical input portion and the optical output portion are individually fabricated. Thereafter, they are multi-chip integrated inside the same package, i.e., the main-surface upper portion of the Si substrate constituting the LSI.

As shown in FIG. 5, the outputted parallel signals are wavelength-multiplexed by the corresponding waveguide type multiplexer 407 comprised of a Lithium Niobate Titanium material, a glass waveguide, or an organic polyimide material and focused on the fibers 112 and 410, followed by leading to the outside.

As will be described later, the present optical interconnection device is equipped thereinside with a phase-locked loop circuit comprised of the silicon germanium transistor circuit, which generates high-speed and low-jitter clock signals.

In the present device, the optical data input/output units are multi-chip integrated into one on one semiconductor substrate constituting the signal processing LSI to thereby make it possible to minimize a connecting distance between each optical data input/output unit and the signal processing LSI. Thus a high-speed characteristic of a data input/output function is realized. Further, the integration thereof into one allows the implementation of reduction in device size.

Furthermore, a signal processing integrated circuit unit such as a signal multiplexing/division-demultiplexing circuit or the like, which needs logic processing of an ultra high-speed signal of a 10 Gbit per second class, comprises a CMOS circuit and implements required operations. Since each of the driver circuits for the vertical cavity surface emitting lasers and photodiodes needs a high-speed driving performance of 10 Gbit per second, it comprises a silicon germanium transistor circuit. The signal processing integrated circuit unit may also preferably be comprised of the silicon germanium transistor circuit in a manner similar to above. Depositing a thin Si—Ge region on an Si substrate when the Si substrate is used as the semiconductor substrate 102 therefor may form an Si—Ge region necessary. However, it may be formed by partly ion-implanting Ge at high speed into the main surface of the Si substrate.

FIG. 3 is a circuit functional block diagram of the interior of the device. The present optical interconnection device has an 8-input and 8-output packet switching function. Eight input ports 209 and 210 and eight output ports 211 and 212 respectively have the function of inputting and outputting 10-bit parallel signals. Each port, which implements a data rate of 10 Gbit per second at maximum for each bit and has a 10-bit configuration, has a data throughput of 100 Gbit per second. The whole device having the eight ports has a packet switching throughput capacity of 800 Gbit per second.

Now look at the flow of data signals inside the respective ports. Wavelength-multiplexed parallel optical signals inputted at 10 Gbit per second×10 bits are subjected to spatial division demultiplexing by the waveguide array-type optical demultiplexer every bits. Thereafter, the photodiodes corresponding to input stages first convert the signals into parallel electric signals of 10 Gbit per second×10 bits. A clock signal is extracted through the use of a clock extracting circuit 202 and one of the parallel signals. Thereafter, each of 10-bit parallel data signals is re-synchronized with the edge of the extracted clock signal. The re-synchronized parallel electric signals of 10 Gbit per second×10 bits are developed into parallel signals of 625 Mbit per second×160 bits by a 1:16 demultiplexer 203. Each of the 160-bit parallel signals is re-synchronized with a common clock signal lying inside a switch core circuit 222 by each elastic buffer circuit 205. Thereafter the signals subjected to decode processing by an error correction/deskew code processing circuit 204, where it is converted into each of parallel signals of 625 Mbits per second×128 bits, which is passed to the corresponding switch core circuit. In the switch core circuit 222, a signal path switching process is executed by a crossbar switching circuit 218 according to a routing table while data is being buffered by an SRAM buffer circuit 213. The 128-bit signals subjected to the crossbar switching process are converted into 625 Mbit per second×160 bits via an error correction/deskew code process (206), which are subjected to time-series multiplexing processing by each 16:1 multiplexer circuit 207, followed by conversion to electric signals of 10 Gbit per second×10 bits.

Each of the 10-bit signal passes through its corresponding 10-channel vertical cavity surface emitting laser array driver circuit 208, where it is converted into an optical parallel signal of 10 Gbit per second×10 bits by the corresponding vertical cavity surface emitting laser diode array. The converted optical parallel signal is wavelength-multiplexed by the waveguide type multiplexer 407 composed of a Lithium Niobate Titanium material, a glass waveguide, or an organic polyimide material and focused on each of the fibers 112 and 410, followed by leading to the outside.

Incidentally, the internal clock signal is generated by multiplying a base clock 313 MHz (220) by a factor of two by means of a phase-locked loop (221), which in turn is distributed to the respective circuits in the device. Control on operation modes of internal circuits and the rewriting of a routing table are controlled through a 30-bit control signal line.

As described above, the layout of the principal functional blocks lying inside the signal processing LSI takes the form shown in FIG. 1. Namely, a logic circuit, particularly, a switch core logic circuit 108 (designated at numeral 222 inclusive of the buffer circuit in FIG. 3) corresponding to the backbone of a signal-path switching function is placed in the central portion of an LSI, i.e., placed in a center position with respect to a plurality of input/output circuit units. Input/output circuit units such as vertical cavity surface emitting laser/photodiodes, optical multiplexers/demultiplexers are placed on the periphery of the LSI. Thus, variations in signal delay between the switch core logic circuit 108 and each of the input/output circuit units can be reduced.

The phase-locked loop circuit 109 (corresponding to reference numeral 223 in FIG. 3) apt to produce noise upon high-speed operation is placed on the periphery of the LSI. A signal output circuit unit, which makes use of a signal outputted from the phase-locked loop, is disposed on the periphery of each of the phase-locked loop circuits 109 and 223. In fact, the phase-locked loop circuit 109 is placed at the central peripheral portion of the right side as shown in FIG. 1, i.e., it is placed so as to be vertically symmetrical with respect to the plurality of laser diode driver circuits 106. Thus, such placement is preferable because a uniform output signal low in variation can be supplied to each of the driver circuits 106 with low noise.

One indicated by a dotted line C in FIG. 2 is a seal composed of an insulator such as ceramic, a resin constituting a package. It is capable of firmly fixing and supporting and hermetically sealing the fibers 103 (302, 410) and the bonding wires 307 and 406.

Incidentally, necessary power-supply pins are placed on the back of an insulating substrate constituting a package bottom face attached to the back of the Si substrate 102. Electrical connections between these pins and respective circuit elements can be achieved by means of the normal LSI and a manufacturing technology of its packaged body.

As a result, the input/output circuits for the present device are separated into the input and output circuit units as described above, which are placed on the periphery of the device. It is easy to mount the input/output optical fibers. Thus, a small-sized and high-speed wavelength division multiplexed optical interconnection device is obtained.

FIG. 4 is a construction diagram illustrating an essential portion of one port (corresponding to a 10-bit input) unit of the optical data input unit as described above. In the present example, 10-bit parallel input signals are multiplexed in wavelength division. One fiber allows the implementation of the input of the signals to the device. The input wavelength-multiplexed input signals of 10 Gbit per second×10 bits are 10 bit-demultiplexed every wavelengths by the arrayed waveguide grating device composed of a Lithium Niobate Titanium material, a glass waveguide, or an organic polyimide material and inputted to a surface mounted type photo diode array, where they are converted into parallel electric signals of 10 Gbit per second×10 bits. The parallel electric signals of the 10-bit parallel synchronized electric signals are sent to a drive IC circuit comprised of a silicon germanium diode circuit. Since an optical medium can be converted from a ribbon fiber into one fiber by use of a wavelength multiplexing technology, a cable can be reduced in size and weight, and the cost thereof can be reduced.

FIG. 5 is a construction diagram illustrating an essential portion of one port (corresponding to a 10-bit input) unit of the optical data output unit. In the present example, 10-bit parallel output signals are multiplexed in wavelength division. One fiber allows the implementation of the output of the signals to the device. The electric signals of 10 Gbit per second×10 bits are converted into optical signals of 10 Gbit per second×10 bits by the laser arrays 405 respectively different in oscillation wavelength and outputted therefrom. The outputted parallel optical signals are wavelength-multiplexed by the waveguide type multiplexer 407 composed of a Lithium Niobate Titanium material, a glass waveguide, or an organic polyimide material and focused on the corresponding fiber 410 and outputted therefrom. Since an optical medium can be converted from a ribbon fiber into one fiber by use of the wavelength multiplexing technology, a cable can be reduced in size and weight, and the cost thereof can be reduced. Incidentally, the printed circuit boards 312 and 409 shown in FIGS. 4 and 5 are made up of the same one common board.

Second Embodiment

Figure 6:
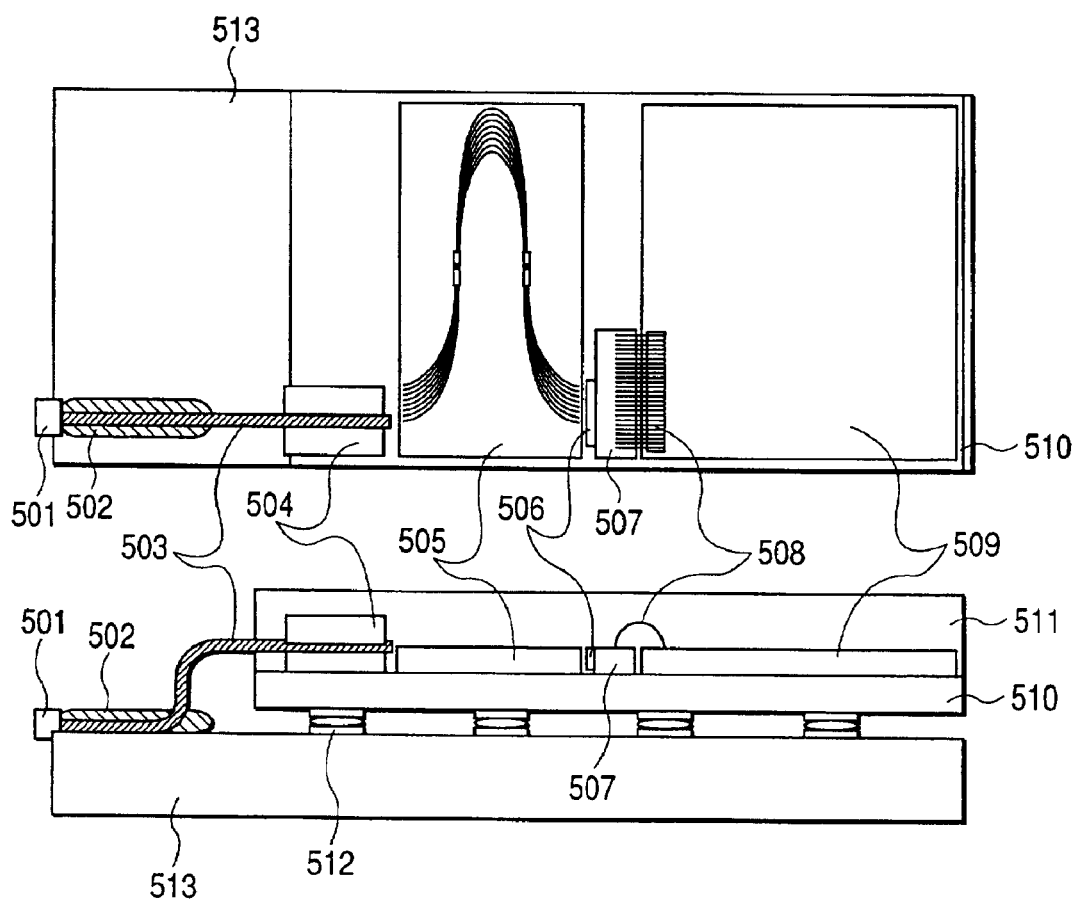
FIG. 6 is an enlarged view illustrating an essential portion of an optical input unit employed in an optical interconnection device according to a second embodiment of the present invention.

A packing structure shown in FIG. 6 is adopted in place of the structure of the optical data input unit described in FIG. 4 in the first embodiment of the present invention. A description will be made of a second embodiment, which adopts a packing structure shown in FIG. 7 in place of the structure of the optical data output unit described in FIG. 5. The second embodiment is similar in electric circuit structure to the first embodiment. Incidentally, the planes of the optical input and output units are shown on the upper sides in FIGS. 6 and 7 and the cross-sections thereof are shown on the lower sides in FIGS. 6 and 7.

Figure 7:
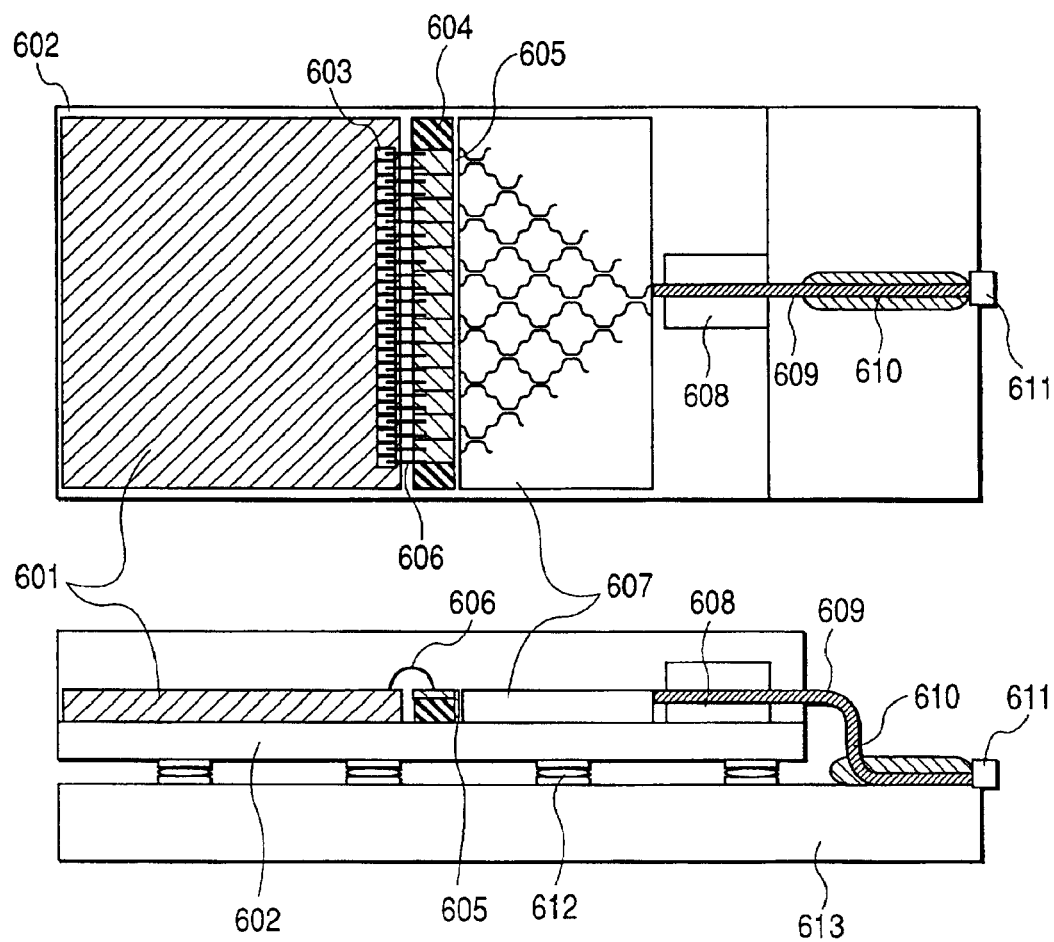
FIG. 7 is an enlarged view illustrating an essential portion of an optical output unit employed in the optical interconnection device according to the second embodiment of the present invention.

The second embodiment has a structure wherein fibers 503 and 609 and fiber receptacles 501 and 611 in which optical parallel signals are inputted and outputted from within a device, are respectively bonded to the surfaces of a mounting printed boards 513 and 613. As shown in FIG. 6, an optical single mode fiber 503 placed onto the board 513 is bent in an S-shaped fashion as viewed in the vertical direction near the device and inserted into the optical interconnection device. Similarly, as shown in FIG. 7, the fiber 609 having received light outputted from the optical interconnection device is bent in an S-shaped fashion as viewed in the vertical direction near the device and leads to the outside of the optical interconnection device. Incidentally, both the printed boards 513 and 613 are composed of the same one common board in a manner similar to the embodiment.

Wavelength-multiplexed optical input signals of 10 Gbit per second×10 bits outputted from the optical single mode fiber 503 are demultiplexed into 10-bit optical signals subjected to spatial division demultiplexing every wavelengths by an arrayed waveguide grating demultiplexer 505, followed by being focused on a surface mounted type photo detector 506. The photo detector 506 converts the optical signals into electric signals of 10 Gbit per second×10 bits, which in turn are inputted to the input stage of each clock extracting circuit 202 described in FIG. 3 through a drive IC circuit 201 comprised of a silicon germanium circuit. On the other hand, 10-bit data signals (packet data signals 10 bits) outputted via a demultiplexer 203 after their signal processing pass through a driver circuit 208 comprised of the silicon germanium circuit, and electro-optic converted into parallel optical output signals of 10 Gbit per second×10 bits by a 10-channel laser array. Thereafter, the parallel optical output signals are wavelength-multiplexed by a waveguide type multiplexer 607 comprised of a Lithium Niobate Titanium material, a glass waveguide, or an organic polyimide material and focused on and outputted from the single mode fiber 609.

Integrally coupling the printed boards 513 and 613 and the fibers 503 and 609 in this way makes it easy to handle the device upon maintenance work or the like as compared with the first embodiment in which the fibers are wired over space.

Third Embodiment

Figure 8:
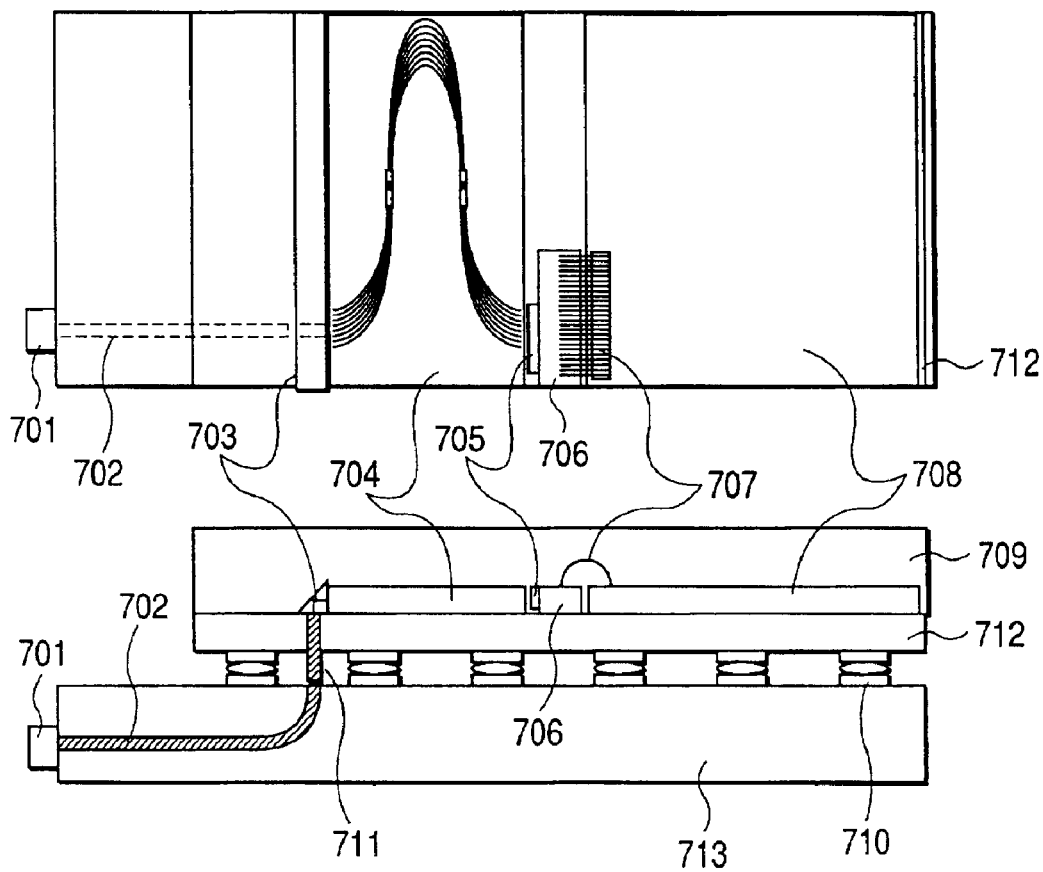
FIG. 8 is an enlarged view illustrating an essential portion of an optical input unit employed in an optical interconnection device according to a third embodiment of the present invention.

A packing structure describe in FIG. 8 is adopted in place of the structure of the optical data input unit described in FIG. 4 in the first embodiment of the present invention. A description will be made of a third embodiment which adopts a packing structure described in FIG. 9 in place of the structure of the optical data output unit described in FIG. 5. Incidentally, the third embodiment is similar in electric circuit structure to the first embodiment. Incidentally, the planes of the optical input and output units are shown on the upper sides in FIGS. 8 and 9, and the cross-sections thereof are shown on the lower sides in FIGS. 8 and 9.

Figure 9:
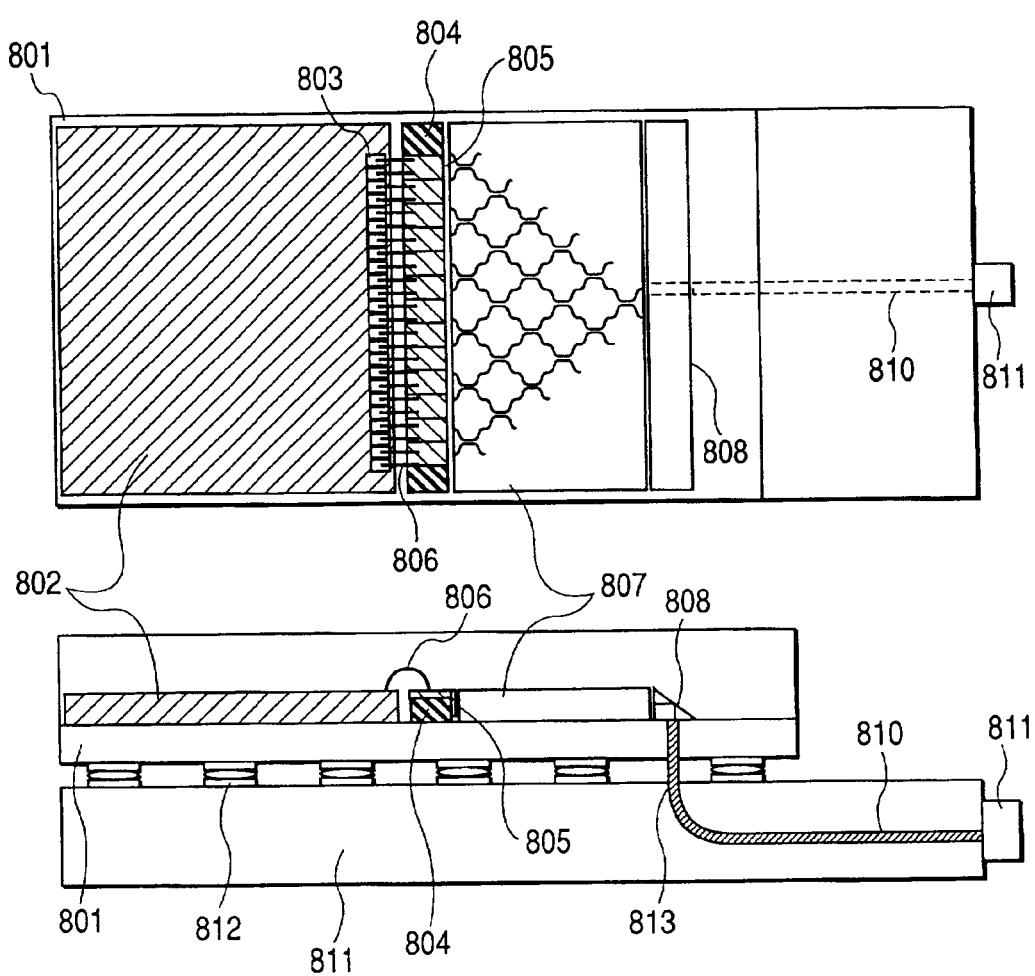
FIG. 9 is an enlarged view illustrating an essential portion of an optical output unit employed in the optical interconnection device according to the third embodiment of the present invention.

In the third embodiment, optical parallel signals are respectively inputted to and outputted from the device through optical fibers 702 and 801 embedded into mounting printed boards 713 and 811 without being done via fibers on the mounting printed boards. The Optical fibers 702 and 810 embedded into the boards 713 and 811 in the horizontal direction parallel to a substrate surface are respectively bent 90° in the vertical direction at positions directly below the device rather than near the device, so that they are exposed outside the board. Short single mode fibers 711 and 813 are placed on the package side on the optical interconnection device side in the form opposed to the fibers exposed at the end faces of the boards 713 and 811. Wavelength-multiplexed optical signals of 10 Gbit per second×10 bits sent from inside the device are inputted from or outputted to the outside of the device via these short fibers on the package side. As shown in FIG. 9 by way of example, parallel electric signals from a driver circuit 802 are converted into optical signals by a laser array 805 at an end face on the internal side of the device of the short fiber 813, and light of their wavelength-multiplexed wave is inputted thereto through a 45° optical switch 808. A configuration similar to above is adopted even on the input side of FIG. 8.

Embedding the optical fiber array into the board and integrating them in this way makes it easy to hand the device upon maintenance work or the like as compared with the first embodiment in which the ribbon fiber is wired over space. If a photo diode array 705 and the laser diode array 805 are temporarily sealed on their corresponding sub-mounts (Si substrates) 712, 801 each constituting the lower side of a package shell, together with the short single mode fibers 711 and 813, then these diodes can be connected optically to other fibers through the short fiber array without being exposed directly to the outside of the device. Therefore, the hermetic sealed packaging of such an optical interconnection device can be implemented before the mounting thereof to a mother board such as a mounting printed board, and hence the device can be made long-lived.

A signal processing LSI is placed within a central portion of a main surface of a semiconductor substrate, and optical transmitting/receiving elements are multi-chip integrated on an upper portion of a peripheral portion of the main surface of the semiconductor substrate, whereby they are integrated into a single package. Further, a wiring length can be reduced and a physical signal band for each connecting wiring can be enlarged. The signal processing LSI is made up of CMOS and a driver circuit for each optical transmitting/receiving element is comprised of a silicon germanium transistor circuit, whereby a modulated signal band can be enlarged and the performance of the input/output of optical signals from a device can be improved. Owing to the mounting of an optical wavelength multiplexing system, connecting fibers are brought into serial form, and a cable size can be rendered compact. The input and output of an ultra high-speed signal can be achieved on a compact device scale, and a further increase in data throughput of an optical interconnection device is allowed.

Principal reference numerals will be listed below to make easy understanding of the drawings.

101: insulating substrate constituting the bottom face of a device package, 102: Si substrate (sub-mount), 103: single mode fiber, 104: photo diode array and arrayed waveguide grating demultiplexer, 105: photo diode array driver circuit, 106: laser diode array driver circuit, 107: laser diode array and optical wavelength multiplexer, 108: logic circuit (switch logic core block circuit) for path switching function, 109: phase-locked loop circuit, 110: buffer circuit (packet buffer memory) for input and output signals, C: seal, 201: 10-channel photo diode array and driver circuit, 202: 10-bit clock extracting circuit, 203: 1:16 demultiplexer, 204: decode circuit for deskew and error correcting code, 205: elastic buffer for re-timing, 206: encode circuit for deskew and error correcting code, 207: 16:1 multiplexer, 208: 10-channel laser array and driver circuit, 209: 10-bit input packet signal (port 0), 210: 10-bit input packet signal (port 7), 211: 10-bit input packet signal (port 0), 212: 10-bit input packet signal (port 7), 213: buffer memory (port 0), 214: routing table storage memory (port 0), 215: buffer memory (port 7), 216: routing table storage memory (port 7), 217: logic circuit for maintenance-system control, 218: 8:8 crossbar switch (logic circuit for path switching function of bit width at each port 128), 219: maintenance-system control signal, 220: input clock signal, 221: multiplication-by-two phase-locked loop, 222: switch core logic circuit (signal processing logic circuit unit), 223: multiplixation-by-16 phase-locked loop, 224: 10 Gbit per second clock signal, 302: single mode fiber, 303: holder having fiber fixing V-shaped groove, 304: arrayed waveguide grating demultiplexer, 305: 10-channel photo diode array, 306: sub-mount for photo diode, 307: bonding wire, 308: photo diode array driver circuit, 310: resin body constituting upper side of package shell, 311: bonding pad and solder ball, 312: mounting printed board, 402: 10-channel laser array driver circuit, 403: bonding pad, 404: sub-mount for 10-channel laser array, 405: 10-channel laser array, 406: bonding wire, 407: 10-channel wavelength multiplexer, 408: holder having fiber fixing V-shaped groove, 409: mounting printed board, 410: single mode fiber, 411: single mode fiber receptacle, 412: bonding pad and solder ball, 501: fiber receptacle, 502: single mode fiber fixing member, 503: single mode fiber, 504: fiber fixing V-shaped groove, 505: arrayed waveguide grating demultiplexer, 506: 10-channel photo diode array, 507: sub-mount for photo diode, 508: bonding wire, 509: photo diode array driver circuit, 510: lower side of package shell, 511: upper side of package shell, 512: bonding pad and solder ball, 513: mounting printed board, 601: 10-channel vertical cavity surface emitting laser array driver circuit, 602: lower side of package shell, 603: bonding pad, 604: sub-mount for 10-channel vertical cavity surface emitting laser array, 605: 10-channel vertical cavity surface emitting laser array, 606: bonding wire, 607: 10-channel wavelength multiplexer, 608: fiber fixing V-shaped groove, 609: single mode fiber, 610: single mode fiber, 611: fiber receptacle, 612: bonding pad and solder ball, 613: mounting printed board, 701: fiber receptacle, 702: substrate-buried single mode fiber, 703: 45° optical switch, 704: arrayed waveguide grating demultiplexer, 705: 10-channel photo diode array, 706: sub-mount for photo diode, 707: bonding wire, 708: photo diode array driver circuit, 709: upper side of package shell, 710: bonding pad and solder ball, 711: short fiber, 712: lower side of package shell, 713: mounting printed board, 801: lower side of package shell, 802: 10-channel vertical cavity surface emitting laser array driver circuit, 803: bonding pad, 804: sub-mount for 10-channel vertical cavity surface emitting laser array, 805: 10-channel vertical cavity surface emitting laser array, 806: bonding wire, 807:

10-channel wavelength multiplexer, 808: 45° optical switch, 810: single mode fiber, 811: fiber receptacle, 811: mounting printed board, 812: bonding pad and solder ball, 813: short fiber.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A wavelength division multiplexed optical interconnection device comprising:
   a plurality of optical signal Input units mach comprising a plurality of optical receivers for respectively receiving a plurality of lights of different wavelenghts and converting said lights of different wavelengths into first electric signals, said optical signal input units being placed in L-shaped form or C-shaped form across sides adjacent to a peripheral portion of a main surface of a semiconductor substrate;
   a signal processing integrated circuit having a logic circuit for effecting a path switching process on the first electric signals delivered from said plurality of optical receivers and for generating second electric signals, said signal processing integrated circuit being placed in a central portion of the main surface of the semiconductor substrate; and
   a plurality of optical signal output units each comprising a plurality of optical emitters for respectively converting the second electric signals generated by said signal processing integrated circuit into light, an optical multiplexer for wavelength-multiplexing the plurality of lights of different wavelengths emitted from the optical emitters, and fibers for transmitting the wavelength-multiplexed light sent from the optical multiplexer to the outside, said optical signal output units being placed in inverted L-shaped form or C-shaped form so as to be opposite to the plurality of optical signal input units across the sides adjacent to the peripheral portion of the main surface of the semiconductor substrate.

2. The wavelength division multiplexed optical interconnection device according to claim 1, wherein, optical receiver driver circuits for respectively driving the plurality of optical receivers are formed in a integrated fashion within the semiconductor substrate located below said plurality of optical signal input units, and optical emitter driver circuits for respectively driving the plurality of optical emitters are formed in an integrated fashion within the semiconductor substrate located below said plurality of optical signal output units.

3. The wavelength division multiplexed optical interconnection device according to claim 2, wherein said plurality of optical signal input units and said plurality of optical signal output units are placed symmetrically with respect to one another on the main surface of the semiconductor substrate.

4. The wavelength division multiplexed optical interconnection device according to claim 2, further including at least one phase-locked loop circuit placed within the semiconductor substrate, for controlling the transfer of the second electric signals to maid optical emitter driver circuits in liaison with the logic circuit for performing the signal-path switching process, and wherein said phase-locked loop circuit is integrally formed within the semiconductor substrate located below said plurality of optical signal output units.

5. The wavelength division multiplexed optical interconnection device according to claim 2, wherein maid optical receiver driver circuits and said optical emitter driver circuits are respectively formed in an Si—Ge semiconductor region, and said signal processing integrated circuit comprises a CMOS circuit.

6. The wavelength division multiplexed optical interconnection device according to claim 2, wherein an insulating substrate is mounted to the bottom face of the semiconductor substrate, which is opposite to the main surface, and terminals for respectively supplying source voltages to said optical receiver driver circuits, said optical emitter driver circuits, and said signal processing integrated circuit are drawn out from the back of the insulating substrate.

7. The wavelength division multiplexed optical interconnection device according to claim 2, wherein said optical multiplexer is comprised of Lithium Niobate Titanium, a glass waveguide, or organic polyimide.

8. A wavelength division multiplexed optical interconnection device comprising:
   a substrate having a predetermined surface and back;
   a plurality of first optical signal transmission media provided on the left side of a peripheral surface of said substrate as viewed from the center line for dividing the peripheral surface of said substrate into two;
   a plurality of optical demultiplexers for respectively wavelength-demultiplexing wavelength-multiplexed signals inputted via said first optical signal transmission media;
   a plurality of optical receivers for respectively receiving the wavelength-demultiplexed plural optical signals therein and converting the same into first electric signals:
   a plurality of first driver circuit units provided on the surface of said substrate in the neighborhood of said plurality of optical receivers and for respectively driving said plurality of optical receivers and amplifying the converted first electric signals to thereby output second electric signals;
   a signal processing electronic circuit unit provided on a central surface of said substrate and for electrically processing the second electric signals to thereby output third electric signals;
   a plurality of optical emitters provided on the right side of the peripheral surface of said substrate as viewed from the center line thereof and for respectively converting the third electric signals outputted from said signal processing electronic circuit unit to optical signals;
   a plurality of optical multiplexers for wavelength-multiplexing the optical signals;
   a plurality of second optical signal transmission media for sending out the wavelength-multiplexed optical signals;
   a plurality of second driver circuit units provided on the surface of said substrate in the neighborhood of said plurality of optical emitters and for respectively driving said plurality of optical emitters; and
   a plurality of terminals provided on the back of said substrate,
   wherein said plurality of first driver circuit units and said plurality of second driver circuit units are formed in an Si—Ge semiconductor region, said signal processing electronic circuit unit is comprised of a CMOS circuit, and source voltages for respectively operating said first driver circuit units, said signal processing electronic circuit unit and said second driver circuit units are respectively supplied from said plurality of terminals provided on the back of said substrate.

9. The wavelength division multiplexed optical interconnection device according to claim 8, wherein the center line for dividing the surface into the two corresponds to a line for connecting the centers of opposite two sides of said substrate surface, said plurality of first optical signal transmission media, said plurality of optical demultiplexers, said plurality of optical receivers; and said plurality of first driver circuit units are provided in a C-shaped fashion over the periphery of said substrate, and said plurality of optical emitters, said plurality of optical multiplexers, said plurality of second optical signal transmission media and said plurality of second driver circuit units are provided in an inverted C-shaped fashion over the periphery of said substrate.

10. The wavelength division multiplexed optical interconnection device according to claim 8, wherein said plurality of first optical signal transmission media, said plurality of optical demultiplexers, said plurality of optical receivers, said plurality of optical emitters, said plurality of optical multiplexers, and said plurality of second optical signal transmission media are monolithically packaged on a board for constituting said plurality of first driver circuit units, said plurality of second driver circuit units and said signal processing electronic circuit unit thereon.

11. The wavelength division multiplexed optical interconnection device according to claim 8, wherein said board further has a phase-locked loop circuit for controlling the transfer of the third electric signals outputted from said signal processing electronic circuit unit to said second driver circuits on its surface, and said second driver circuit units are placed on both sides of the phase-looked loop circuit along the periphery of said signal processing electronic circuit unit with the phase-locked loop circuit as the center.

12. A wavelength division multiplexed optical interconnection device comprising:

input circuit units including,
  a substrate having a predetermined surface and back;
  a plurality of first optical transmission media;
  a plurality of optical demultiplexers for respectively wavelength-demultiplexing wavelength-multiplexed lights inputted via said first optical transmission media;
  a plurality of optical receivers for respectively receiving the wavelength-demultiplexed plural lights of different wavelengths therein and converting the same into first electric signals; and
  a plurality of first driver circuit units provided on the surface of said substrate in the neighborhood of said plurality of optical receivers and for respectively driving said plurality of optical receivers and amplifying the converted first electric signals to thereby output second electric signals; output circuit units including,
a signal processing electronic circuit unit provided on a central surface of said substrate and for electrically processing the second electric signals;
a plurality of optical emitters for respectively converting third electric signals outputted from said signal processing electronic circuit unit to light;
a plurality of optical multiplexers for wavelength-multiplexing the lights of different wavelengths;
a plurality of second optical signal transmission media for sending out the wavelength-multiplexed light;
a plurality of second driver circuit units provided on the surface of said substrate in the neighborhood of said plurality of optical emitters and for respectively driving said plurality of optical emitters; and
a plurality of terminals provided on the back of said substrate,
wherein with a line for connecting the centers of two opposite sides of said substrate surface and dividing the surface into two as a center line, said input circuit units are provided on the left side of the center line in a C-shaped fashion over the periphery of said substrate, and said output circuit units are provided on the right side of the center line in an inverted C-shaped fashion over the periphery of said substrate, said input circuit units, said signal processing electronic unit and said output circuit units are monolithically packaged on said substrate, and source voltages for operating said first driver circuit units, said signal processing electronic circuit unit and said second driver circuit units are respectively supplied from said plurality of terminals provided on the back of said substrate.

* * * * *